(12) United States Patent
    Zhang

(10) Patent No.: US 11,195,573 B2
(45) Date of Patent: Dec. 7, 2021

(54) WRITE OPERATION CIRCUIT, SEMICONDUCTOR MEMORY, AND WRITE OPERATION METHOD

(71) Applicant: CHANGXIN MEMORY TECHNOLOGIES, INC., Hefei (CN)

(72) Inventor: Liang Zhang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/313,001

(22) Filed: May 6, 2021

(65) Prior Publication Data

US 2021/0272621 A1 Sep. 2, 2021

Related U.S. Application Data

(63) Continuation of application No. PCT/CN2020/097504, filed on Jun. 22, 2020.

(30) Foreign Application Priority Data

Oct. 25, 2019 (CN) .......................... 201911021460.1

(51) Int. Cl.
    *G11C 11/4093* (2006.01)
    *G11C 11/4096* (2006.01)
    (Continued)

(52) U.S. Cl.
    CPC ...... *G11C 11/4093* (2013.01); *G06F 13/1668* (2013.01); *G11C 11/4096* (2013.01); *H03M 9/00* (2013.01); *G11C 7/10* (2013.01)

(58) Field of Classification Search
    CPC .... G11C 11/4093; G11C 11/4096; G11C 7/10
    (Continued)

(56) References Cited

U.S. PATENT DOCUMENTS

2008/0082900 A1* 4/2008 Yoon .................... G11C 7/1006
                                                        714/768
2010/0042889 A1 2/2010 Ebrahim
                        (Continued)

FOREIGN PATENT DOCUMENTS

CN          104681085 A    6/2015
CN          107545918 A    1/2018
                        (Continued)

OTHER PUBLICATIONS

JEDEC Standard, GDDR5 SGRAM, JESD212, Dec. 2009, JEDEC Solid State Technology Association, JEDEC Standard No. 212 (Year: 2009).*

*Primary Examiner* — Connie C Yoha
(74) *Attorney, Agent, or Firm* — Kilpatrick Townsend & Stockton LLP

(57) ABSTRACT

Embodiments provide one write operation circuit, which includes: a serial-to-parallel conversion circuit that performs serial-to-parallel conversion on a first DBI data of a DBI port to generate a second DBI data for transfer by a DBI signal line, and that generates an input data of a data buffer module depending on the second DBI data; a data buffer module that determines whether to flip a global bus depending on the input data of the data buffer module; the DBI decoding module that decodes a global bus data according to the second DBI data, and writes the decoded data into a memory bank, where decoding includes determining whether to flip the global bus data; and a precharge module that is coupled to a precharge signal line and that sets the initial state of the global bus to high.

10 Claims, 4 Drawing Sheets

(51) Int. Cl.
*G11C 7/10* (2006.01)
*H03M 9/00* (2006.01)
*G06F 13/16* (2006.01)

(58) Field of Classification Search
USPC .................. 365/189.16, 219, 189.01, 189.05
See application file for complete search history.

(56) References Cited

U.S. PATENT DOCUMENTS

2014/0289440 A1* 9/2014 Shu ..................... G06F 13/4282
710/307
2015/0071009 A1* 3/2015 Ku ....................... G11C 7/1006
365/189.05

FOREIGN PATENT DOCUMENTS

| CN | 108872837 A | 11/2018 |
| CN | 109582507 A | 4/2019 |
| CN | 210575117 U | 5/2020 |

* cited by examiner

WRITE OPERATION CIRCUIT, SEMICONDUCTOR MEMORY, AND WRITE OPERATION METHOD

CROSS REFERENCE

This application is a continuation of PCT/CN2020/097504, filed on Jun. 22, 2020, which claims the priority to and benefit of Chinese patent application number 201911021460.1, entitled "Write Operation Circuit, Semiconductor Memory, and Write Operation Method", and filed on Oct. 25, 2019 with China National Intellectual Property Administration, the entire contents of which are incorporated herein by reference in its entirety.

TECHNICAL FIELD

This application relates to the technical field of semiconductor memories, and in particular to a write operation circuit, a semiconductor memory, and a write operation method.

BACKGROUND

Semiconductor memories include static random access memory (SRAM), dynamic random access memory (DRAM), and synchronous dynamic random access memory (SDRAM), Read-Only Memory (ROM), flash memory, and so on.

In the DRAM protocol of the Joint Electron Device Engineering Council (JEDEC), there are specific speed and power saving requirements for DRAM. It therefore has become an urgent problem to be solved as to make DRAM more power-saving while also ensuring signal integrity and reliability of data transfer and storage.

SUMMARY

Embodiments of the present application provide a write operation circuit, a semiconductor memory, and a write operation method to solve or alleviate one or more technical problems in the prior art.

In a first aspect, an embodiment of the present application provides a write operation circuit applied to a semiconductor memory, which includes a includes a Data Queue (DQ) port, a data bus inversion (DBI) port, and a memory bank, the write operation circuit including:

a serial-to-parallel conversion circuit that is coupled to the DBI port and the DQ port for performing serial-to-parallel conversion on a first DBI data of the DBI port to generate a second DBI data for transfer by a DBI signal line, and that generates an input data of a data buffer module based on the second DBI data and an input data of the DQ port;

the data buffer module that includes a plurality of NMOS transistors, where the gate of each of the plurality of NMOS transistors is coupled to the serial-to-parallel conversion circuit for receiving the input data of the data buffer module, the drain of the NMOS transistor is coupled to a global bus, and the data buffer module is used to determine whether to flip the global bus depending on the input data of the data buffer module;

a DBI decoding module that is coupled to the memory bank, and that receives a global bus data on the global bus and receives the second DBI data through the DBI signal line, and is used to decode the global bus data according to the second DBI data, and write the decoded data into the memory bank, the decoding including determining whether to flip the global bus data; and a precharge module that is coupled to a precharge signal line and is used to set the initial state of the global bus to high.

In one embodiment, when the number of low data bits in an external data is greater than a preset value, the first DBI data is set to high, and the input data of the DQ port is a flipped data of the external data. When the number of low data bits in the external data is less than or equal to the preset value, the first DBI data is set to low, and the input data of the DQ port is the external data. Furthermore, the serial-to-parallel conversion circuit is used to perform serial-to-parallel conversion on the input data of the DQ port to generate a converted data, and when the second DBI data is high, flip the converted data to generate the input data of the data buffer module, and when the second DBI data is low, use the converted data as the input data of the data buffer module.

In one embodiment, the serial-to-parallel conversion circuit is used to perform serial-to-parallel conversion on an one-bit first DBI data to generate an M-bit second DBI data. The global bus data is divided into a number of M groups, and the M-bit second DBI data has an one-to-one correspondence with the M groups of global bus data. The DBI decoding module includes M DBI decoding sub-modules. The DBI decoding sub-modules are coupled to the respective memory banks. Each DBI decoding sub-module is used to decode the respective group of global bus data according to the respective bit in the second DBI data, where M is an integer greater than 1.

In one embodiment, each DBI decoding sub-module includes:

a first inverter, where an input end of the first inverter is coupled to the DBI signal line; and a decoding unit, where an input end of the decoding unit is coupled to the global bus, and an output end of the decoding unit is coupled to the memory bank, where the decoding unit is used to output the flipped data of the global bus data when the second DBI data is high, and output the global bus data when the second DBI data is low.

In an embodiment, the decoding unit includes:

a second inverter, where an input end of the second inverter is coupled to the global bus;

a first logic AND gate, where two input ends of the first logic AND gate are respectively coupled to the output end of the first inverter and the output end of the second inverter;

a second logic AND gate, where the two input ends of the second logic AND gate are respectively coupled to the DBI signal line and to the global bus; and a logic NOR gate, where the two input ends of the logic NOR gate are respectively coupled to the output end of the first logic AND gate and the output end of the second logic AND gate, and the output end of the logic NOR gate is coupled to the memory bank.

In one embodiment, the precharge module includes a plurality of PMOS transistors and a plurality of hold circuits, where the gate of the PMOS transistor is coupled to a precharge signal line, the drain of the PMOS transistor is coupled to the global bus, and the input and output ends of the hold circuit are coupled to the global bus.

In a second aspect, an embodiment of the present application provides a semiconductor memory that includes a DQ port, a DBI port, a memory bank, and the write operation circuit of any of the foregoing embodiments.

In a third aspect, an embodiment of the present application provides a write operation method applied to a semiconductor memory, which includes a includes a DQ port, a DBI port, and a memory bank, the write operation method including:

setting an initial state of a global bus to high;

performing serial-to-parallel conversion on a first DBI data of a DBI port to generate a second DBI data;

generating an input data of the data buffer module based on the second DBI data and an input data of the DQ port;

determining whether to flip the global bus according to the input data of the data buffer module;

decoding the global bus data on the global bus according to the second DBI data, the decoding including determining whether to flip the global bus data; and writing the decoded data into the memory bank.

In one embodiment, the operation of generating an input data of the data buffer module based on the second DBI data and an input data of the DQ port includes:

performing serial-to-parallel conversion on the input data of the DQ port to generate a converted data;

when the second DBI data is high, flipping the converted data to generate the input data for the data buffer module; and when the second DBI data is low, using the converted data as the input data of the data buffer module.

In one embodiment, the operation of decoding the global bus data on the global bus according to the second DBI data includes:

performing serial-to-parallel conversion on an one-bit first DBI data of the DBI port to generate an M-bit second DBI data, where M is an integer greater than 1;

dividing the global bus data into a number of M groups; and decoding the respective group of global bus data according to the corresponding bit in the second DBI data.

By adopting the foregoing technical solutions, embodiments of the present application can reduce the number of flips of the global bus under the precharge pull-up architecture, thereby greatly compressing the current and reducing the power consumption.

The above overview is intended for mere illustrative purposes and is not intended to be limiting in any means. In addition to the illustrative aspects, embodiments, and features described above, further aspects, embodiments, and features of the present application will be easily understood by referring to the accompanying drawings and the following detailed description.

BRIEF DESCRIPTION OF THE DRAWINGS

In the drawings, unless otherwise specified, the same reference numerals refer to the same or similar parts or elements throughout the multiple drawings. These drawings are not necessarily drawn to scale. It should be understood that these drawings only depict some embodiments according to the present application, and should not be regarded as limiting the scope of the present application.

DESCRIPTION OF REFERENCE SIGNS

Figure 1:
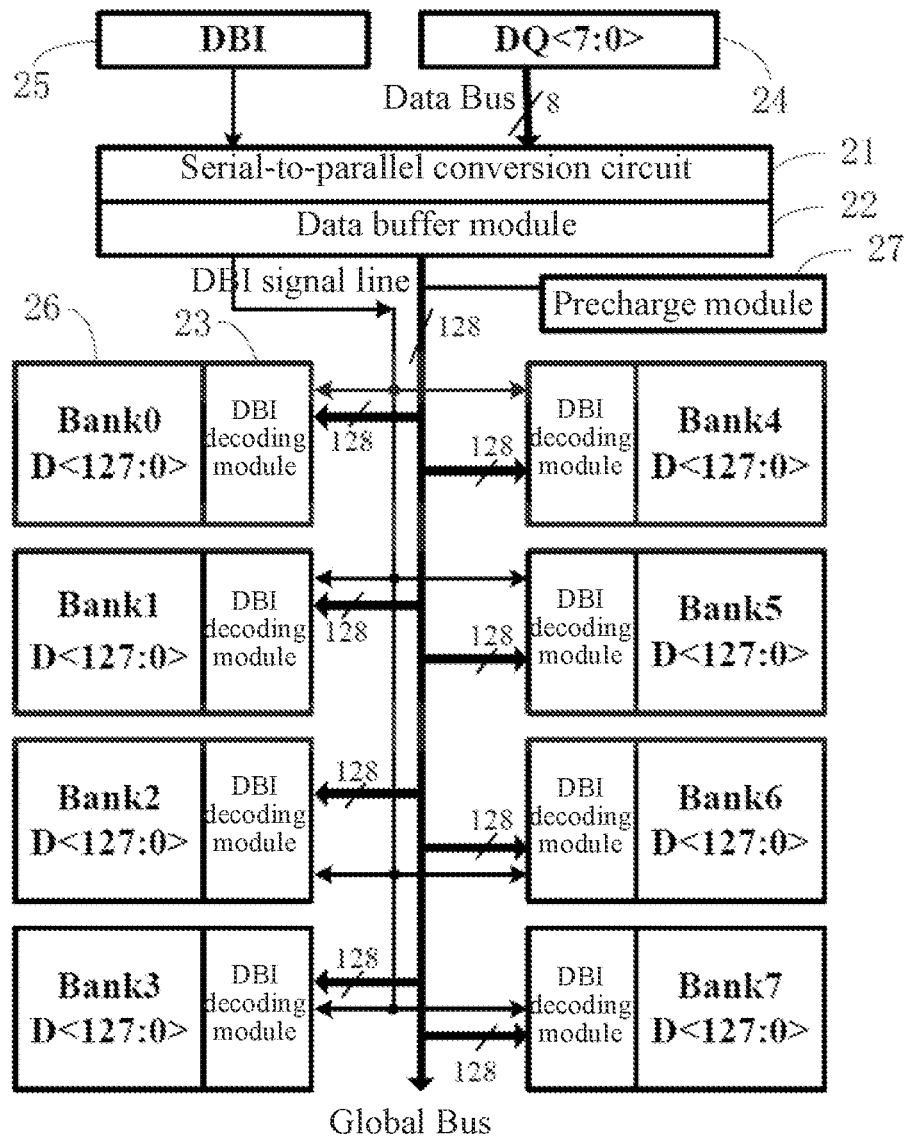
FIG. 1 schematically shows a block diagram of a part of the structure of a semiconductor memory according to an embodiment of the present application.

10: Controller;
20: Semiconductor memory;
21: Serial-to-parallel conversion circuit;
22: Data buffer module;
23: DBI decoding module;
24: DQ port;
25: DBI port;
26: Memory bank;
27: Precharge module;
221: PMOS transistor;
222: NMOS transistor;
223: Hold circuit;
230: DBI decoding submodule;
231: First inverter;
232: Decoding unit;
232A: Second inverter;
232B: First logic AND gate;
232C: Second logic AND gate;
232D: Logic NOR gate.

DETAILED DESCRIPTION OF EMBODIMENTS

Illustrative embodiments will now be described more fully below in connection with the accompanying drawings. However, these illustrative embodiments may be able to be practiced in a variety of forms, and therefore should not be construed as being limited to the embodiments set forth herein. On the contrary, these embodiments are provided so that this application will become comprehensive and complete, and will be able to fully convey the concept of these illustrative embodiments to those having ordinary skill in the art. In these drawings, same reference numerals denote the same or similar parts, and thus they will not be repeatedly detailed.

FIG. 1 schematically shows a block diagram of a part of the structure of a semiconductor memory according to an embodiment of the present application. As illustrated in FIG. 1, the semiconductor memory 20 includes a DQ port 24, a data Bus inversion (DBI) port 25, a memory bank (Bank) 26 and a write operation circuit. The write operation circuit includes a global Bus, a DBI signal line, a serial-to-parallel conversion circuit 21, a data buffer module (Data Buffer) 22, and a DBI decoding module (Decoder) 23. In one embodiment, the semiconductor memory is a DRAM, such as a fourth-generation double-rate synchronous dynamic random access memory (Double Data Rate SDRAM 4, DDR4 for short).

In an example, as shown in FIG. 1, a 8-bit input data DQ<7:0> may be input from the DQ port 24, so that the data to be written D<127:0> would be written into the memory bank 26 through the write operation circuit. One Active command turns on the only one designated memory bank 26, and the write operation can only be performed on one memory bank 26. In other words, when one of the memory banks 26 (i.e. Bank<7:0>) is operating, the other Banks are not working. It should be noted, however, that the number of memory banks 26, the number of data bits of each memory bank 26, and the number and the number of data bits of the DQ ports 24 will not be limited in this embodiment. For example, there may be one DQ port 24, which is used to input a 16-bit input data; there may also be two DQ ports 24, that is, each DQ port 24 is used to input a 8-bit input data DQ<7:0> or DQ<15:8>.

Figure 2:
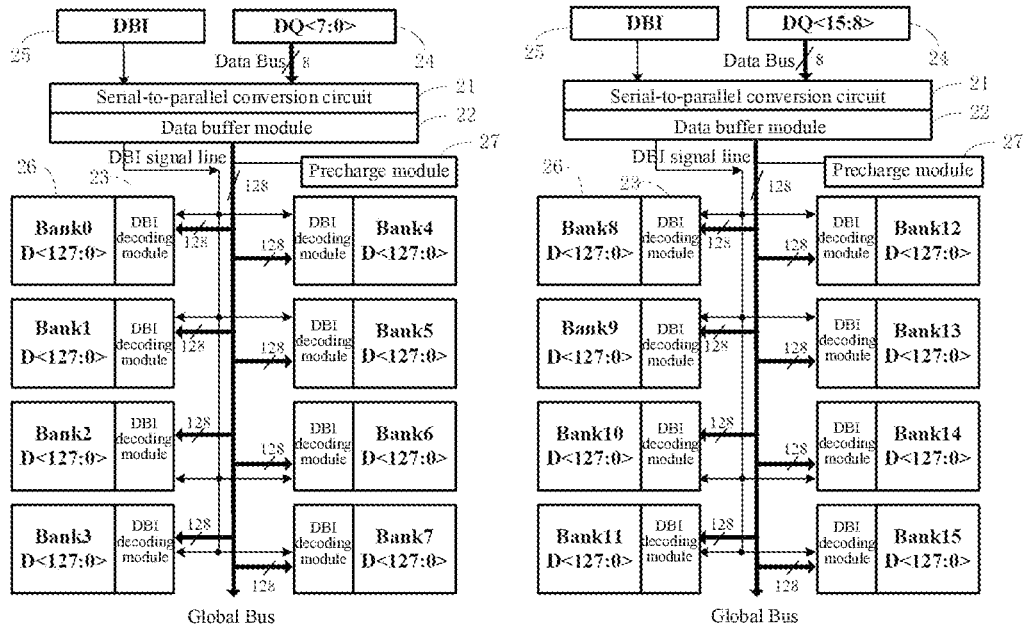
FIG. 2 schematically shows a block diagram of a part of the structure of a semiconductor memory according to another embodiment of the present application.

In another example, as illustrated in FIG. 2, of the 16-bit input data DQ<15:0> input from the DQ port 24, the input data DQ<7:0> performs a write operation to a set of memory banks Bank<7:0> through one such write operation circuit as mentioned above. The input data DQ<15:8> performs a write operation on another set of memory banks Bank<15:8> through another write operation circuit as mentioned above. Accordingly, among the eight memory banks 26 corresponding to DQ<15:8> (i.e. Bank<15:8>), when one bank is working, the other banks do not work.

Figure 3:
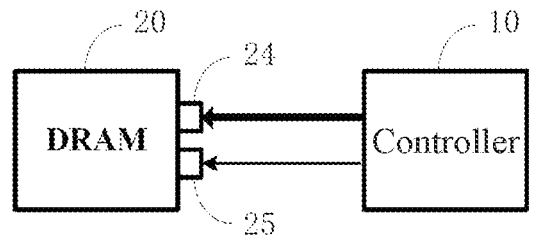
FIG. 3 schematically shows a principle diagram of the DBI function.

Hereinafter the function of the DBI port 25 will be described in connection with FIG. 3. The on-die termination (ODT) of the semiconductor memory 20 can absorb the current of the DQ port 24 through a grounded pin thus preventing the signal from being reflected in the internal circuits of the semiconductor memory 20. During the operation of the semiconductor memory 20, the size of the ODT can be adjusted to match the controller 10. In an example, the ODT structure is a pull-up structure. When the data of the DQ port 24 is "0", the leakage current through the ODT is relatively large, which will increase the power consumption. Therefore, when the number of low data bits in the external data is greater than the preset value, the first DBI data of the DBI port 25 may be set to high, and the external data may be flipped to obtain the input data of the DQ port. Otherwise when the number of low data bits is less than or equal to the preset value, the first DBI data may be set to low, and the input data of the DQ port is just the external data.

For example, in the external data written to the DQ port 24, if there are relatively more data bits of "0", then each bit of the external data will be flipped before being input into the semiconductor memory 20. Meanwhile, the first DBI data of the DBI port will be set to high indicating that the input data is a flipped data of the input data. For example, if the input data DQ<7:0> is <11111111> and the first DBI data is equal to 0, then it means that the input data DQ<7:0> is the original external data, that is, the external data is also <11111111>. If the input data DQ<7:0> is <11111111> and the first DBI data is equal to 1, then it means that the input data DQ<7:0> is the flipped data of the external data, namely the data obtained by flipping the external data. Thus, the external data is <00000000>. The same as described above also applies to the input data DQ<15:8> of DQ port 24. As such, in the input data DQ<15:0> of the DQ port 24, there are comparatively more data bits "1", which can reduce the power consumption.

As meant herein, a "high" data bit may mean a data bit that is a equal to "1", while a "low" data bit may be a data bit that is equal to "0". Data flipping can be understood as changing from "0" to "1", or from "1" to "0". The flipping of the data line or the signal line may be understood as changing a high level to a low level, or changing a low level to a high level.

The semiconductor memory 20 may have an array structure, and different units may have the same structure. However, because the input data may be different, the output data of different units may be different. The following takes one memory bank as an example to introduce the write operation circuit of this embodiment.

As illustrated in FIG. 1, the serial-parallel conversion circuit 21 is coupled to the DBI port 25 and the DQ port 24, and is used to perform serial-to-parallel conversion on the first DBI data of the DBI port 25 to generate a second DBI data for transfer by a DBI signal line, and further generate the input data of the data buffer module 22 based on the second DBI data and the input data DQ of the DQ port.

In one embodiment, the serial-to-parallel conversion circuit 21 is used to perform serial-to-parallel conversion on the input data of the DQ port 24 to generate a converted data, and determine whether to flip the converted data depending on the second DBI data so as to generate the input data of the data buffer module.

For example, the serial-to-parallel conversion circuit 21 may perform a serial-to-parallel conversion on the input 8-bit input data DQ<7:0> to generate a 128-bit converted data, and then determine whether to flip the converted data depending on the 16-bit second DBI data DBI<15:0>, before outputting an 128-bit input data D2'<127:0> to the data buffer module 22.

In an example, the 128-bit converted data is divided into 16 groups, so that each group of the converted data includes 8 bits, and one bit in the second DBI data corresponds to this group of 8-bit converted data, thus generating a group of 8-bit input data D2'.

Note that the serial-to-parallel conversion circuit 21 may include two serial-to-parallel conversion modules for performing serial-to-parallel conversion on the input data of the DQ port 24 and the first DBI data of the DBI port 25, separately, which however will not be specifically limited in this embodiment.

The precharge module 27 is coupled to the precharge signal line (Precharge), and is used to set the initial state of the global bus to high. That is to say, in this embodiment, the semiconductor memory 20 adopts a precharge pull-up (High) global bus transfer structure.

Figure 4:
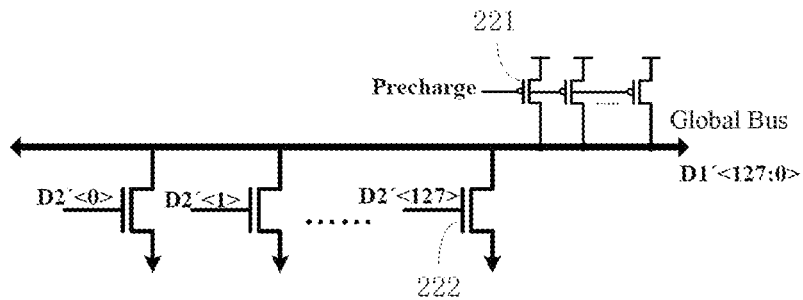
FIG. 4 schematically shows a circuit diagram (corresponding to one memory bank) of a data buffer module and a precharge module according to an embodiment of the present application.
Figure 5:
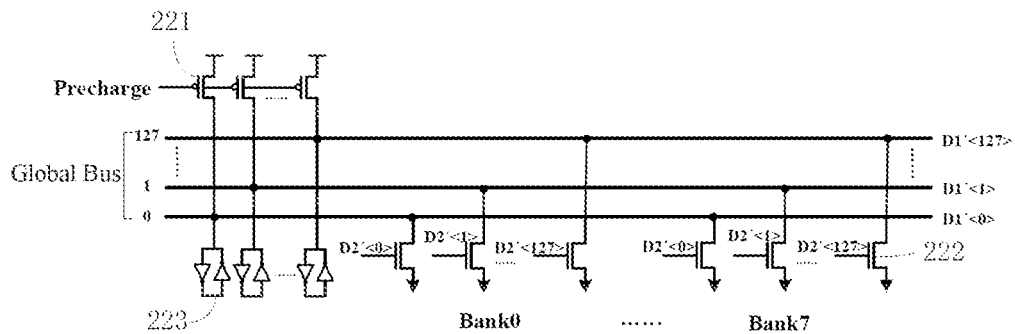
FIG. 5 schematically shows a circuit diagram (corresponding to multiple memory banks) of a data buffer module and a precharge module according to an embodiment of the present application.

FIG. 4 schematically shows a circuit diagram (corresponding to one memory bank) of a data buffer module and a precharge module according to an embodiment of the present application. FIG. 5 schematically shows a circuit diagram (corresponding to 8 memory banks) of a data buffer module and a precharge module according to an embodiment of the present application.

As illustrated in FIGS. 4 and 5, the data buffer module includes a plurality of NMOS (Negative Channel Metal Oxide Semiconductor) transistors 222. The precharge module includes a plurality of PMOS (Positive Channel Metal Oxide Semiconductor) transistors 221. As illustrated in FIG. 5, the pre-charging module further includes a plurality of hold circuits 223. The gate of the PMOS transistor 221 is coupled to the precharge signal line, and the drain of the PMOS transistor 221 is coupled to the global Bus. The gate of the NMOS transistor 222 is coupled to the serial-to-parallel conversion circuit for receiving the input data of the data buffer module. The drain of the NMOS transistor 222 is coupled to the global bus, so that the data buffer module will determine whether to flip the global bus depending on the input data of the data buffer module. The input and output ends of the hold circuit 223 are coupled to the global bus, thereby forming a positive feedback circuit.

The Precharge serves the function of setting the initial state of each global bus to high. The specific process may include generating a pull-up pulse (pulse, lasting about 2 ns) by the Precharge, thus pulling up the corresponding global bus for a while. The hold circuit 223 then forms a positive feedback and locks the global bus at high level, but the ability of the hold circuit 223 to pull up and pull down current is relatively weak. When a global bus needs to change to a low level, it means that the data line corresponding to the global bus (that is, the data line coupled to the gate of the corresponding NMOS transistor 222) may be pulled up for a bit (also a pulse, lasting about 2 ns), so that the corresponding NMOS transistor 222 will pull down the global bus for a while (the pull-down capability is greater than the pull-up capability of the hold circuit 223). Then the global bus will be locked to a low level through positive feedback to complete the flipping action of the data line.

Since there are relatively more data bits "0" in the input data D2'<127:0>of the data buffer module 22 (that is, the data on the data lines coupled to the gates of the NMOS transistors 222), the number of global buses that need to be flipped will be less, and there will be relatively more data bits "1" in the global bus data D1'<127:0>. Therefore, the IDD4W (write current) of the semiconductor memory will be reduced, thereby reducing the power consumption of the semiconductor memory. In other words, if there are comparatively more data bits "1" in the global bus data, the IDD4W can be reduced, thereby reducing the power consumption.

Since there are relatively more data bits "1" in the input data DQ<7:0>of DQ port 24 and it has not been decoded at this time, there will be relatively more data bits "1" in the 128-bit global bus data D1'<127:0>. Accordingly, in the semiconductor memory 20 shown in FIG. 2, there are relatively more data bits "1" in the input data DQ<15:0>. Since it has not been decoded at this time, the 256-bit global bus data (including the 128-bit global bus data corresponding to DQ<7:0>and the 128-bit global bus data corresponding to DQ<15:8>), there are relatively more data bits "1".

Further, the DBI decoding module 23 is coupled to the respective memory bank 26 and receives the second DBI data through the DBI signal line, and receives the global bus data through the global bus. The DBI decoding module 23 is configured to decode the global bus data according to the second DBI data, and write the decoded data into the memory bank 26. The decoding includes determining whether to flip the global bus data. The decoded data is the data to be written, such as D<127:0>. In other words, before the data is written into the memory bank 26, there are relatively more data bits "1" that are transferred on the global bus.

In the related art, in the condition that the DBI function is enabled, when the semiconductor memory is performing a write operation, the semiconductor memory will decode the input data according to the status of the DBI port when the input data just enters the semiconductor memory. If the status of DBI is "1", all input data bits will be inverted (flipped). Otherwise if the status of DBI is "0", all input data bits will not be inverted, that is, the original value will be maintained. This decoding module is disposed at the position just before the input data enters the semiconductor memory, that is, before the serial-to-parallel conversion module. Thus, in the related art, there are relatively more data bits "0" that are transferred by the global bus inside the semiconductor memory, which will result in an excessively large IDD4W current hence high power consumption.

In one embodiment, the first DBI data has only one bit, and the serial-to-parallel conversion circuit 21 is used to perform serial-to-parallel conversion on this one-bit first DBI data to generate an M-bits second DBI data. For example, the serial-to-parallel conversion circuit 21 may perform serial-to-parallel conversion on the one-bit data of the DBI port 25 to generate a 16-bit second DBI data DBI<15:0>.

Figure 6:
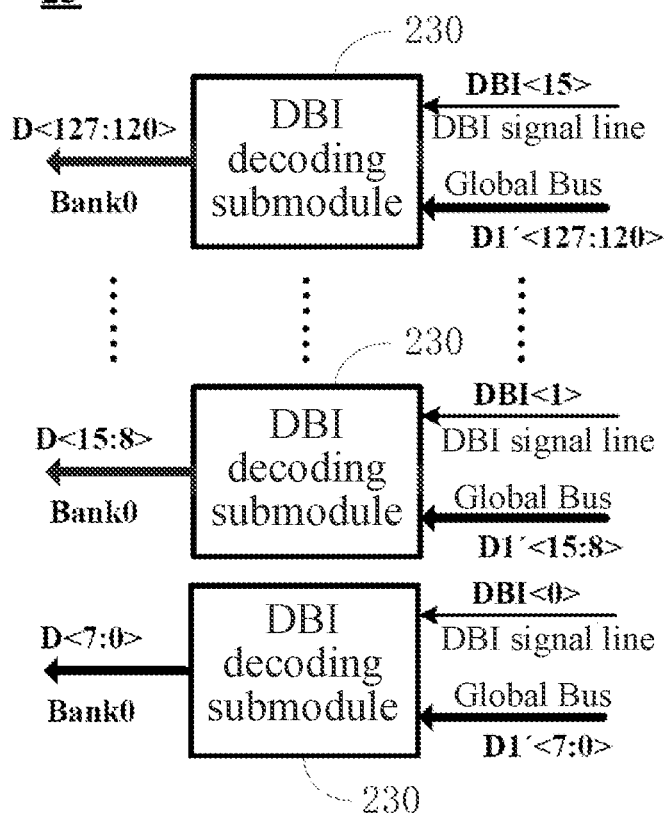
FIG. 6 schematically shows a block diagram of a DBI decoding module according to an embodiment of the present application.

The global bus data is divided into a number of M groups, and the M-bit second DBI data is in an one-to-one correspondence with the M groups of global bus data. As illustrated in FIG. 6, the DBI decoding module 23 includes a number of M DBI decoding sub-modules 230, and all DBI decoding sub-modules 230 are coupled to one same memory bank. Each DBI decoding sub-module 230 is used to decode the corresponding group of global bus data according to the respective bit in the second DBI data, where M is an integer greater than 1.

The DBI decoding module 23 outputs the flipped data of the global bus data when the second DBI data is high, and outputs the global bus data when the second DBI data is low.

For example, the global bus data D1'<127:0>may be divided into 16 groups, so that each group of global bus data includes 8 bits. Correspondingly, the second DBI data includes 16 bits, such as DBI<15:0>. Each group of global bus data corresponds to one bit of DBI data. Thus, when DBI<15>=1, the decoded data output from the DBI decoding module, i.e., the data D<127:120>to be written to the memory bank (such as Bank0) is the flipped data of the global bus data D1'<127:120>. Otherwise when DBI<15>=0, the data D<127:120>to be written is just the global bus data D1'<127:120>. Similarly, when DBI<1>=1, the data D<15:8>to be written is the flipped data of the global bus data D1'<15:8>. When DBI<1>=0, the data D<15:8>to be written is just the global bus data D1'<15:8>. When DBI<0>=1, the data D<7:0>to be written is the flipped data of the global bus data D1'<7:0>.When DBI<0>=0, the data D<7:0>to be written is just the global bus data D1'<7:0>.

In an example, there are multiple global buses, which are divided into M (M is an integer greater than 1) groups, and each global bus transfers one bit of the global bus data. For example, there may be 128 global buses, which are divided into 16 groups.

In particular, global bus <0>transfers global bus data D1'<0>, global bus <1>transfers global bus data D1'<1>, . . . , and global bus <127>transfers global bus data D1'<127>.

In one example, there are 16 DBI signal lines, where each DBI signal line transfers one bit of the second DBI data. For example, the DBI signal line <0>transfers the second DBI data bit DBI<0>, which is used to represent whether the data D<7:0>to be written is the flipped data of the global bus data D1'<7:0>. The DBI signal line <1>transfers the second DBI data bit DBI<1>, which is used to represent whether the data D<15:8>to be written is the flipped data of the global bus data D1'<15:8>, and so on and so forth, until the DBI signal line <15>transfers the second DBI data bit DBI<15>, which is used to represent whether the data D<127:120>to be written is the flipped data of the global bus data D1'<127:120>.

As illustrated in FIG. 2, according to the semiconductor memory 20 of this embodiment, when DQ<7:0>inputs <11111111>for the first time and the first DBI data is equal to 0, and then inputs <11111111>for the second time and the first DBI data is equal to 1, the corresponding each group of global bus data (8 bits) will always be <11111111>before being written to the memory bank 26, as long as the bit in the second DBI data corresponding to this group is equal to 1. Thus, in this embodiment, when the global bus data has 256 bits (including 128-bit global bus data corresponding to DQ<7:0>and 128-bit global bus data corresponding to DQ<15:8>),if it is needed to flip the 256-bit global bus data, the outcome would be that it is only needed to flip the 32 bits in the second DBI data, thereby greatly compressing the IDD4W current.

Figure 7:
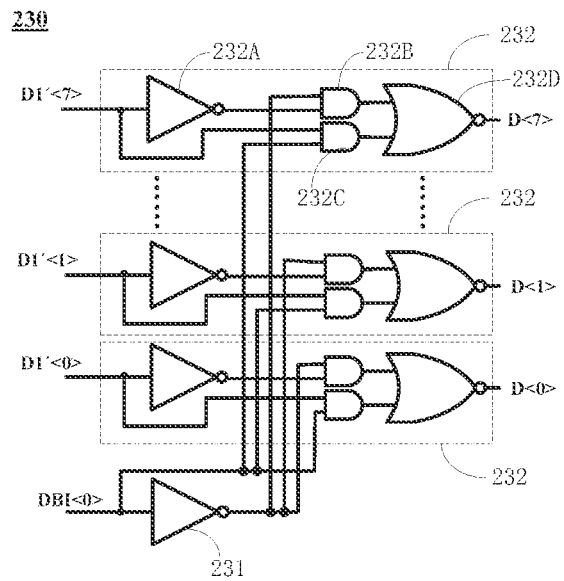
FIG. 7 schematically shows a block diagram of a DBI decoding submodule according to an embodiment of the present application.

In one embodiment, as illustrated in FIG. 7, the DBI decoding sub-module 230 may include a first inverter 231 and a decoding unit 232. The input end of the first inverter 231 is coupled to the DBI signal line. The input end of the decoding unit 232 is coupled to the global bus. The output end of the decoding unit 232 is coupled to the memory bank, and is used to output the flipped data of the global bus data when the second DBI data is high, and output the global bus data when when second DBI data is low.

In one embodiment, the decoding unit 232 includes a second inverter 232A, a first logic AND gate 232B, a second logic AND gate 232C, and a logic NOR gate 232D. The input end of the second inverter 232A is coupled to the global bus. The two input ends of the first logic AND gate 232B are respectively coupled to the output end of the first inverter 231 and the output end of the second inverter 232A. The two input ends of the second logic AND gate 232C are respectively coupled to the DBI signal line and the global bus. The two input ends of the logic NOR gate 232D are respectively coupled to the output end of the first logic AND gate 232B and the output end of the second logic AND gate 232C, and the output end of the logic NOR gate 232D is coupled to the memory bank.

As illustrated in FIG. 7, taking the decoding unit 232 that corresponds to the
DBI<0>, data D<7:0>to written, and the global bus data D1'<7:0>as an example, when DBI<0>=1, D<7>is equal to the flipped data of D1'<7>, ..., D<1>is equal to the flipped data of D1'<1>, and D<0>is equal to the flipped data of D1'<0>. Otherwise when DBI<0>=0, D<7>is equal to D1'<7>, ..., D<1>is equal to D1'<1>, and D<0>is equal to D1'<0>.

It should be noted that all DBI decoding sub-modules 230 may be the same, but their output data may be different because the input data is different. FIG. 7 illustrates the structure of one of the DBI decoding sub-modules 230, where the data input to the DBI decoding sub-module is D1'<7:0>and DBI<0>, and the output data is D<7:0>. In addition, this embodiment does not limit the implementation circuit of the DBI decoding sub-module 230, as long as the flipped data of the global bus data can be output when the second DBI data is 1, and the global bus data can be output when the second DBI data is 0.

The semiconductor memory 20 of this embodiment may further include other structures such as a sense amplifier, a precharge circuit, etc. in practical applications, which are all existing technologies and so are not repeatedly detailed in this embodiment for brevity.

Figure 8:
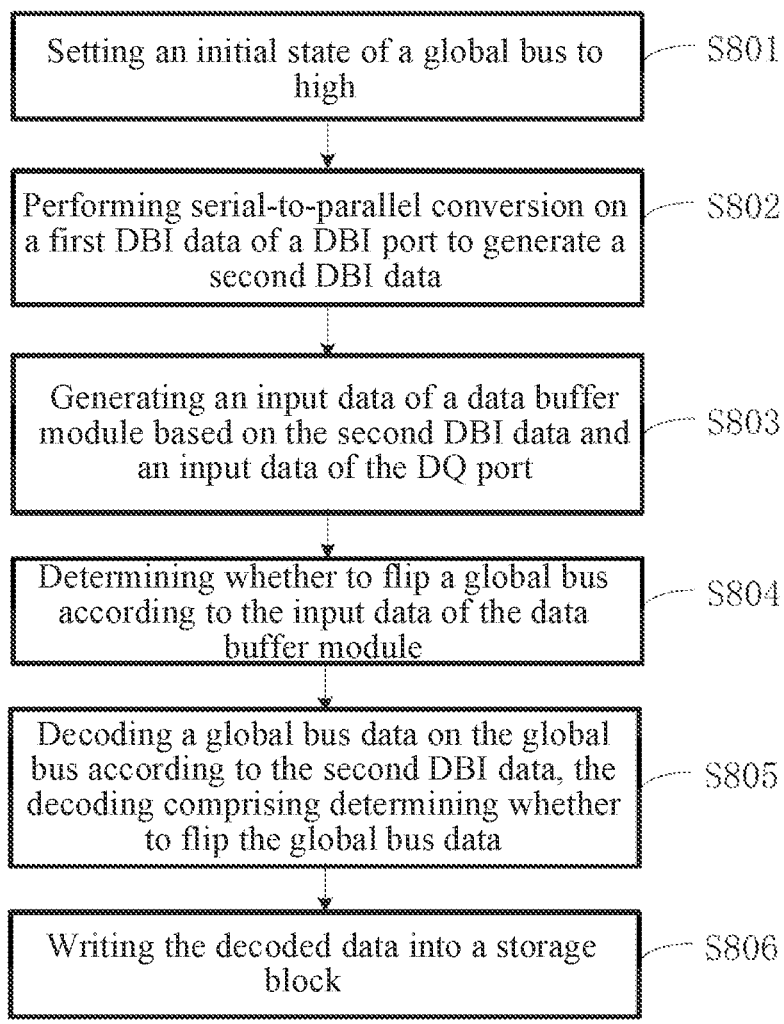
FIG. 8 schematically shows a flowchart of a write operation method according to an embodiment of the present application.

FIG. 8 schematically shows a flowchart of a write operation method according to an embodiment of the present application. This writing operation method can be applied to the semiconductor memory 20 described above. As shown in FIG. 8, the write operation method may include the following operations:

S801: setting an initial state of a global bus to high;
S802: performing serial-to-parallel conversion on a first DBI data of a DBI port to generate a second DBI data;

S803: generating an input data of the data buffer module based on the second
DBI data and an input data of the DQ port;
S804: determining whether to flip the global bus according to the input data of the data buffer module;
S805: decoding the global bus data on the global bus according to the second DBI data, the decoding including determining whether to flip the global bus data; and
S806: writing the decoded data into the memory bank.

In one embodiment, the operation S803 may include: performing serial-to-parallel conversion on the input data of the DQ port to generate a converted data, in the case that the second DBI data is high, flipping the converted data to generate the input data of the data buffer module, and when the second DBI data is low, using the converted data as the input data of the data buffer module.

In one embodiment, the operation S805 may include: performing serial-parallel conversion on the one-bit first DBI data of the DBI port to generate an M-bit second DBI data, where M is an integer greater than 1; dividing the global bus data into a number of M groups; and decoding the corresponding group of global bus data according to the respective bit in the second DBI data.

The write operation circuit provided by this embodiment of the present application can be applied to a semiconductor memory with a global bus transfer structure of the precharge pull-up type. By setting the DBI decoding module between the serial-to-parallel conversion circuit and the memory bank, it is possible to realize that there are more data bits "1" transferred on the global bus before the data is written into the memory bank, thereby reducing the number of internal global bus flips, resulting in a significantly compressed current and reduced power consumption.

As used herein, references to the terms "one embodiment", "some embodiments", "examples", "specific examples", or "some examples" etc. are intended to mean that specific features, structures, materials, or characteristics described in connection with this embodiment or example are included in at least one embodiment or example of the present application. Furthermore, the described specific features, structures, materials or characteristics can be combined in any one or more embodiments or examples in a suitable manner. In addition, those having ordinary skill in the art may be able to combine the different embodiments or examples and the features of the different embodiments or examples described in this specification, in the premise that no contradiction or conflict is present.

Furthermore, the described features, structures or characteristics may be combined in one or more embodiments in any suitable manner. However, those having ordinary skill in the art will be able to realize that the technical solutions of the present application can be practiced without the presence of one or more of the specific details, or other methods, components, materials, devices, steps, etc. can be used. In other cases, well-known structures, methods, devices, implementations, materials, or operations are not shown or described in detail to avoid obscuring various aspects of the present application.

As used herein, terms "first", "second", or the like are merely used for illustrative purposes, and shall not be construed as indicating relative importance or implicitly indicating the number of technical features specified. Thus, the features defined by "first" and "second" may explicitly or implicitly include one or more of such features. As used herein, terms "multiple" or "a plurality of" means two or more, unless otherwise specifically defined.

It should be noted that although the various steps of the method in this application are described in a specific order shown in the drawings, this does not require or imply that these steps must be performed in the specific order, or that all the steps shown must be performed to achieve the desired result. Additionally or alternatively, some steps may be omitted, multiple steps may be combined into one step for execution, and/or one step may be decomposed into multiple steps for execution, etc. The above-mentioned drawings are merely schematic illustrations of the processing included in the method according to the exemplary embodiments of the present application, and are not intended for limitation. It is readily understood that the processings shown in the above drawings does not indicate or limit the time order of these processings. In addition, it is readily understood that these processes can be executed synchronously or asynchronously in multiple modules, for example.

Furthermore, although the spirit and principle of this application have been described with reference to several specific embodiments, it should be understood that this application will not be limited to the disclosed specific embodiments, and the division of various aspects does not mean that the features in these aspects cannot be combined for benefit; in fact, this division is merely intended for the convenience of presentation. This application is intended to cover various modifications and equivalent arrangements included within the spirit and scope of the appended claims. The foregoing merely depicts some specific implementations of this application, but the scope of protection of this application will not be limited thereto. Any person familiar with the technical field will be able to easily think of various changes or substitutions within the technical scope disclosed in this application, and these should all be covered by the scope of protection of this application. Therefore, the scope of protection of this application should be subject to the scope of protection of the appended claims.

What is claimed is:

1. A write operation circuit applied to a semiconductor memory, the semiconductor memory comprising a Data Queue (DQ) port, a data bus inversion (DBI) port, and a memory bank, the write operation circuit comprising a serial-to-parallel conversion circuit, a data buffer module, a DBI decoding module and a precharge module, wherein the serial-to-parallel conversion circuit is coupled to the DBI port and the DQ port, and the serial-to-parallel conversion circuit is
configured to perform serial-to-parallel conversion on a first DBI data of the DBI port to generate a second DBI data for transfer by a DBI signal line, and
configured to generate an input data of the data buffer module based on the second DBI data and an input data of the DQ port;
the data buffer module comprises a plurality of NMOS transistors, each of the plurality of NMOS transistors comprising a gate coupled to the serial-to-parallel conversion circuit for receiving the input data of the data buffer module, and a drain coupled to a respective global bus, wherein the data buffer module is configured to determine whether to flip the global bus based on the input data of the data buffer module;
the DBI decoding module is coupled to the memory bank and configured to receive a global bus data on the global bus and receive the second DBI data through the DBI signal line, and configured to decode the global bus data according to the second DBI data, and write the decoded global bus data into the memory bank, the decoding comprising determining whether to flip the global bus data; and
the precharge module is coupled to a precharge signal line and configured to set an initial state of the global bus to high.

2. The write operation circuit of claim 1, wherein when a number of low data bits in an external data is greater than a preset value, the first DBI data is set to high, and the input data of the DQ port is an flipped data of the external data; and when the number of low data bits in the external data is less than or equal to the preset value, the first DBI data is set to low, and the input data of the DQ port is the external data; and
wherein the serial-to-parallel conversion circuit is configured to perform serial-to-parallel conversion on the input data of the DQ port to generate a converted data, configured to flip the converted data to generate the input data of the data buffer module when the second DBI data is high, and configured to use the converted data as the input data of the data buffer module when the second DBI data is low.

3. The write operation circuit of claim 1, wherein the serial-to-parallel conversion circuit is configured to perform serial-to-parallel conversion on an one-bit first DBI data to generate an M-bit second DBI data;
wherein the global bus data is divided into a number of M groups, and the M-bit second DBI data is in one-to-one correspondence with the M groups of global bus data;
wherein the DBI decoding module comprises a number of M DBI decoding sub-modules coupled to the memory bank, wherein each of the M DBI decoding sub-modules is configured to decode a respective group of global bus data according to a respective bit in the second DBI data, where M is an integer greater than 1.

4. The write operation circuit of claim 3, wherein each DBI decoding sub-module comprises:
a first inverter, comprising an input end coupled to the DBI signal line; and
a decoding unit, comprising an input end coupled to the respective global bus and an output end coupled to the memory bank, and configured to output flipped data of the global bus data when the second DBI data is high, and output the global bus data when the second DBI data is low.

5. The write operation circuit of claim 4, wherein the decoding unit comprises:
a second inverter, comprising an input end coupled to the respective global bus;
a first logic AND gate, comprising two input ends that are respectively coupled to an output end of the first inverter and an output end of the second inverter;
a second logic AND gate, comprising two input ends that are respectively coupled to the DBI signal line and to the global bus; and
a logic NOR gate, comprising two input ends of that are respectively coupled to an output end of the first logic AND gate and an output end of the second logic AND gate, and an output end that is coupled to the memory bank.

6. The write operation circuit of claim 1, wherein the precharge module comprises a plurality of PMOS transistors and a plurality of hold circuits, wherein each of the plurality of PMOS transistors comprises a gate coupled to a precharge signal line, and a drain coupled to the respective global bus, wherein each of the plurality of hold circuits comprises an input end and an output end both coupled to the global bus.

7. A semiconductor memory, comprising a Data Queue (DQ) port, a data bus inversion (DBI) port, a memory bank, and a write operation circuit, wherein the write operation circuit comprising a serial-to-parallel conversion circuit, a data buffer module, a DBI decoding module and a precharge module, wherein the serial-to-parallel conversion circuit is coupled to the DBI port and the DQ port, and the serial-to-parallel conversion circuit is configured to perform serial-to-parallel conversion on a first DBI data of the DBI port to generate a second DBI data for transfer by a DBI signal line, and configured to generate an input data of the data buffer module based on the second DBI data and an input data of the DQ port;

the data buffer module comprises a plurality of NMOS transistors, each of the plurality of NMOS transistors comprising a gate coupled to the serial-to-parallel conversion circuit for receiving the input data of the data buffer module, and a drain coupled to a respective global bus, wherein the data buffer module is configured to determine whether to flip the global bus based on the input data of the data buffer module;

the DBI decoding module is coupled to the memory bank and configured to receive a global bus data on the global bus and receive the second DBI data through the DBI signal line, and configured to decode the global bus data according to the second DBI data, and write the decoded global bus data into the memory bank, the decoding comprising determining whether to flip the global bus data; and the precharge module is coupled to a precharge signal line and configured to set an initial state of the global bus to high.

8. A write operation method applied to a semiconductor memory, the semiconductor memory comprising a Data Queue (DQ) port, a data bus inversion (DBI) port, and a memory bank, the write operation method comprising:

setting an initial state of a global bus to high;

performing serial-to-parallel conversion on a first DBI data of the DBI port to generate a second DBI data;

generating an input data of a data buffer module based on the second DBI data and an input data of the DQ port;

determining whether to flip the global bus according to the input data of the data buffer module;

decoding a global bus data on the global bus according to the second DBI data, the decoding comprising determining whether to flip the global bus data; and writing the decoded global bus data into a memory bank.

9. The write operation method of claim 8, wherein the generating an input data of a data buffer module based on the second DBI data and an input data of the DQ port comprises:

performing serial-to-parallel conversion on the input data of the DQ port to generate a converted data;

when the second DBI data is high, flipping the converted data to generate the input data for the data buffer module; and when the second DBI data is low, using the converted data as the input data of the data buffer module.

10. The write operation method of claim 8, wherein the decoding a global bus data on the global bus according to the second DBI data comprises:

performing serial-to-parallel conversion on an one-bit first DBI data of the DBI port to generate an M-bit second DBI data, M being an integer greater than 1;

dividing the global bus data into a number of M groups; and decoding a corresponding group of global bus data according to a respective bit in the second DBI data.

* * * * *